US009614503B2

(12) United States Patent
Park

(10) Patent No.: US 9,614,503 B2
(45) Date of Patent: Apr. 4, 2017

(54) MOS PASS TRANSISTORS AND LEVEL SHIFTERS INCLUDING THE SAME

(71) Applicant: SK hynix Inc., Gyeonggi-do (KR)

(72) Inventor: Sung Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/953,243

(22) Filed: Nov. 27, 2015

(65) Prior Publication Data
US 2017/0040984 A1   Feb. 9, 2017

(30) Foreign Application Priority Data

Aug. 3, 2015 (KR) .................. 10-2015-0109756

(51) Int. Cl.
| | | |
|---|---|---|
| H01L 21/70 | (2006.01) |
| H03K 3/356 | (2006.01) |
| H01L 27/092 | (2006.01) |
| H01L 27/02 | (2006.01) |
| H01L 29/06 | (2006.01) |
| H01L 29/49 | (2006.01) |
| H01L 29/423 | (2006.01) |

(52) U.S. Cl.
CPC ... *H03K 3/356104* (2013.01); *H01L 27/0207* (2013.01); *H01L 27/0922* (2013.01); *H01L 29/0649* (2013.01); *H01L 29/4236* (2013.01); *H01L 29/495* (2013.01)

(58) Field of Classification Search
CPC ............. H01L 29/0649; H01L 2924/00; H01L 29/66545; H01L 29/66795; H01L 27/11582; H01L 29/0653; H01L 29/785; H01L 27/1157; H01L 21/76224; H01L 27/11556; H01L 2924/00014; H01L 29/0847; H01L 23/528
See application file for complete search history.

(56) References Cited

U.S. PATENT DOCUMENTS 8,664,714 B2   3/2014  Liu

FOREIGN PATENT DOCUMENTS

KR   1020060009487   2/2006

*Primary Examiner* — Robert Bachner
(74) *Attorney, Agent, or Firm* — IP & T Group LLP

(57) ABSTRACT

A MOS pass transistor includes a semiconductor layer having first conductivity, a trench isolation layer disposed in the semiconductor layer to define a first active region and a second active region, a first junction region having second conductivity, disposed in the first active region, and being in contact with a first sidewall of the trench isolation layer, a second junction region having the second conductivity, disposed in the second active region, being in contact with a second sidewall of the trench isolation layer, and being spaced apart from the first junction region, and a gate electrode disposed over the trench isolation layer. A lower portion of the gate electrode extends from a top surface of the trench isolation layer into the trench isolation layer to a predetermined depth.

21 Claims, 3 Drawing Sheets

MOS PASS TRANSISTORS AND LEVEL SHIFTERS INCLUDING THE SAME

CROSS-REFERENCE TO RELATED APPLICATIONS

The present application claims priority under 35 U.S.C 119(a) to Korean Patent Application No. 10-2015-0109756, filed on Aug. 3, 2015, which is herein incorporated by reference in its entirety as set forth in full.

BACKGROUND

1. Technical Field

Various embodiments of the present disclosure relate to MOS pass transistors and level shifters including the same.

2. Related Art

Level shifters are widely used in various semiconductor devices that perform level transition from a certain voltage level to another voltage level. Particularly, the level shifters may be used to convert a low voltage level to a high voltage level. For example the level shifters may be used to drive output pins of integrated circuits to a logic level which is higher than an Internal logic level of the integrated circuits. In some cases, the level shifters may be used to convert a high voltage level to a low voltage level, In general, the level shifters have been used to drive word lines connected to control gates of memory cell transistors constituting a cell array, which is employed in nonvolatile memory devices such as electrically erasable programmable read only memory (EEPROM) devices, flash EEPROM devices, nonvolatile random access memory (NOVRAM) devices, one-time programmable (OTP) devices or multi-time programmable (MTP) devices. A write-in voltage higher than a read-out voltage has to be supplied to the memory cell transistors in order to write data into the memory cell transistors. For example, while the read-out voltage for example, 1.8 volts to 5.5 volts, which is equal to or lower than a power supply voltage VDD that is, a digital supply voltage, is applied to the control gates of the memory cell transistors in a read mode the write-in voltage for example 10 volts to 12.5 volts, which is higher than the power supply voltage VDD may be applied to the control gates of the memory cell transistors in a program mode. In general, the high voltage such as the write-in voltage also, referred to as a program voltage, used in the program mode is generated by voltage multiplier circuits such as charge pumping circuits disposed in chips. The on-chip charge pumping circuits may raise a unit price of a chip and may cause high power consumption of the chip. Thus, the level shifters have been used for both the program mode that is, a write mode, and the read mode. In such a case, an output supply voltage level VPP of the level shifters may be lowered in the read mode.

SUMMARY

Various embodiments are directed to MOS pass transistors and level shifters including the same.

According to one embodiment, a MOS pass transistor includes a semiconductor layer having first conductivity, a trench isolation layer disposed in the semiconductor layer to define a first active region and a second active region, a first junction region having second conductivity, disposed in the first active region, and being in contact with a first sidewall of the trench isolation layer, a second junction region having the second conductivity, disposed in the second active region, being in contact with a second sidewall of the trench isolation layer, and being spaced apart from the first junction region, and a gate electrode disposed over the trench isolation layer. A lower portion of the gate electrode extends from a top surface of the trench isolation layer into the trench isolation layer to a predetermined depth.

According to another embodiment, a level shifter includes a first N-channel MOS transistor, a second N-channel MOS transistor, a first P-channel MOS pass transistor, and a second P-channel MOS pass transistor. At least one of the first and second P-channel MOS pass transistors comprises a semiconductor layer having N-type conductivity, a trench isolation layer disposed in the semiconductor layer and defining a first active region and a second active region, a first junction region having P-type conductivity, disposed in the first active region, and being in contact with a first sidewall of the trench isolation layer, a second junction region having the P-type conductivity, disposed in the second active region, being in contact with a second sidewall of the trench isolation layer, and being spaced apart from the first junction region, and a gate electrode disposed over the trench isolation layer. A lower portion of the gate electrode extends from a top surface of the trench isolation layer into the trench isolation layer to a predetermined depth.

According to another embodiment, a level shifter includes a semiconductor substrate having a P-type region and an N-type region, first and second N-channel MOS transistors disposed on the P-type region of the semiconductor substrate, and first and second P-channel MOS pass transistors disposed on the N-type region of the semiconductor substrate. Each of the first and second P-channel MOS pass transistors comprises a trench isolation layer disposed in an upper region of the N-type region and defining a first active region and a second active region, a first well region having P-type conductivity, disposed in the first active region and being in contact with a first sidewall of the trench isolation layer, a second well region having the P-type conductivity, disposed in the second active region, being in contact with a second sidewall of the trench isolation layer, and being spaced apart from the first well region, and a first contact plug, a second contact plug, and a third contact plug disposed on the first well region, the trench isolation layer, and the second well region, respectively. A lower portion of the gate electrode extends from a top surface of the trench isolation layer into the trench isolation layer to a predetermined depth.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second third etc, may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside another element, it may directly contact the other element, or at least one intervening element may be present therebetween. Accordingly, the terms such as "on, "over," above," under," "beneath," "below," "side," "aside," and the like that are used herein are for the purpose of describing particular embodiments only and are not intended to limit the scope of the present disclosure.

It will be further understood that when an element is referred to as being "connected" or 'coupled' to another element, it can be directly connected or coupled to the other element or intervening elements may be present. In contrast, when an element is referred to as being "directly connected" or "directly coupled" to another element, there are no intervening elements present.

Figure 1:
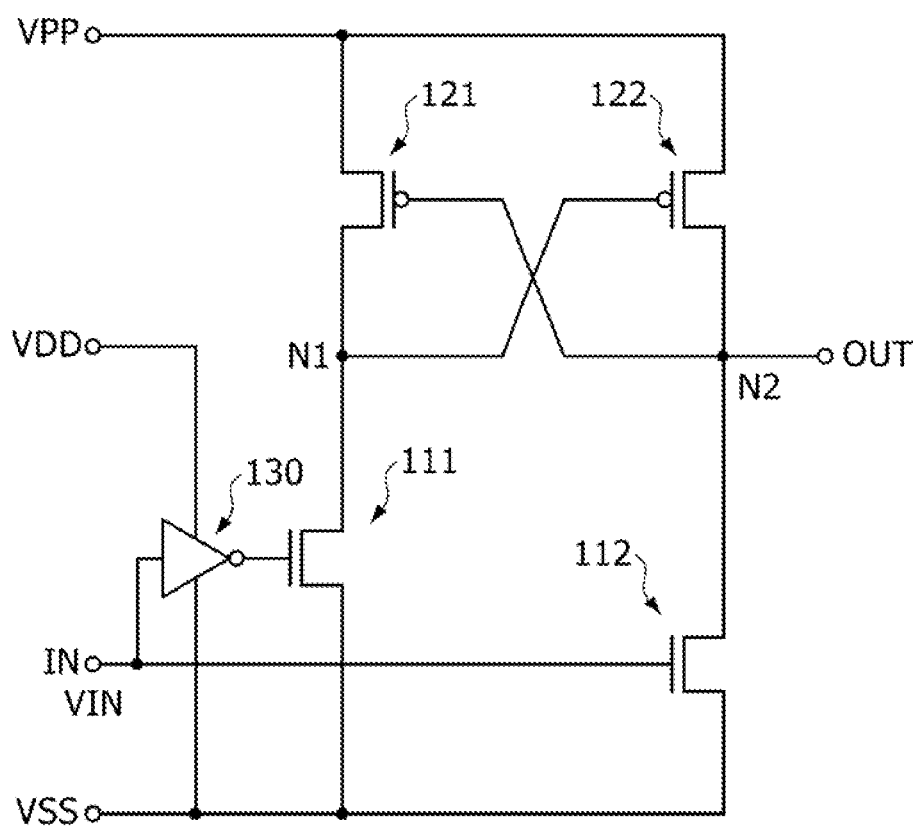
FIG. 1 is a circuit diagram illustrating a four-transistor level shifter according to an embodiment.

FIG. 1 is a circuit diagram illustrating a four-transistor level shifter 100 according to an embodiment. Referring to FIG. 1, the level shifter 100 may include a first N-channel MOS transistor 111, a second N-channel MOS transistor 112, a first P-channel MOS pass transistor 121 and a second P-channel MOS pass transistor 122. Although FIG. 1 illustrates an example in which a P-channel MOS transistor is employed as a MOS pass transistor, the present disclosure is not limited thereto. That is in some embodiments, an N-channel MOS transistor may be employed as the MOS pass transistor. In the event that the MOS pass transistor is realized using an N-channel MOS transistor, a level shifter including the N-channel MOS pass transistors may have substantially the same configuration as the level shifter described in the following embodiment except for conductivity types of some elements, Source terminals of the first and second N-channel MOS transistors 111 and 112 may be connected to a ground voltage VSS terminal. Source terminals of the first and second P-channel MOS pass transistors 121 and 122 may be connected to a source voltage VPP terminal. A drain terminal of the first N-channel MOS transistor 111 may be connected to a drain terminal of the first P-channel MOS pass transistor 121. A drain terminal of the second N-channel MOS transistor 112 may be connected to a drain terminal of the second P-channel MOS pass transistor 122.

A gate terminal of the second P-channel MOS pass transistor 122 may be connected to the drain terminals of the first N-channel MOS transistor 111 and the first P-channel MOS pass transistor 121 to constitute a first node N1. A gate terminal of the first P-channel MOS pass transistor 121 may be connected to the drain terminals of the second N-channel MOS transistor 112 and the second P-channel MOS pass transistor 122 to constitute a second node N2. That is, the gate terminal of the first P-channel MOS pass transistor 121 may be connected to the drain terminal of the second P-channel MOS pass transistor 122 and the gate terminal of the second P-channel MOS pass transistor 122 may be connected to the drain terminal of the first P-channel MOS pass transistor 121. Accordingly, the first and second P-channel MOS pass transistors 121 and 122 may constitute a cross-coupled pair.

The second node N2 may be connected to an output terminal OUT, An input terminal IN may be connected to an input terminal of an inverter 130. An output terminal of the inverter 130 may be connected to a gate terminal of the first N-channel MOS transistor 111. The input terminal IN may also be connected to a gate terminal of the second N-channel MOS transistor 112.

If an input signal VIN inputted to the level shifter 100 through the input terminal IN has a "low" level that is, the ground voltage VSS level, the second N-channel MOS transistor 112 may be turned off. The inverter 130 may be driven by a bias voltage VDD. In such a case, if the input signal VIN has a "low" level, a high level voltage that is, the bias voltage VDD, may be applied to the gate terminal of the first N-channel MOS transistor 111. Thus, the first N-channel MOS transistor 111 may be turned on to drive the first node N1 to a level of the ground voltage VSS. Since the first node N1 is connected to the gate terminal of the second P-channel MOS pass transistor 122, the second P-channel MOS pass transistor 122 may be turned on to drive the second node N2 to a level of the source voltage VPP. Accordingly, if the input signal VIN having a "low" level is inputted to the level shifter 100, the first node N1 may be driven to have a level of the ground voltage VSS and the output terminal OUT may be driven to have a level of the source voltage VPP.

If the input signal VIN inputted to the level shifter 100 through the input terminal IN has a "high" level that is, the bias voltage VDD level, the second N-channel MOS transistor 112 may be turned on to drive the second node N2 to a level of the ground voltage VSS. In such a case, since a low level signal is applied to the gate terminal of the first N-channel MOS transistor 111 by the inverter 130, the first N-channel MOS transistor 111 may be turned off. Since the second node N2 is connected to the gate terminal of the first P-channel MOS pass transistor 121, the first P-channel MOS pass transistor 121 may be turned on to drive the first node N1 to a level of the source voltage VPP. Accordingly, if the input signal VIN having a "high" level is inputted to the level shifter 100, the first node N1 may be driven to have a level of the source voltage VPP and the output terminal OUT may be driven to have a level of the ground voltage VSS.

Figure 2:
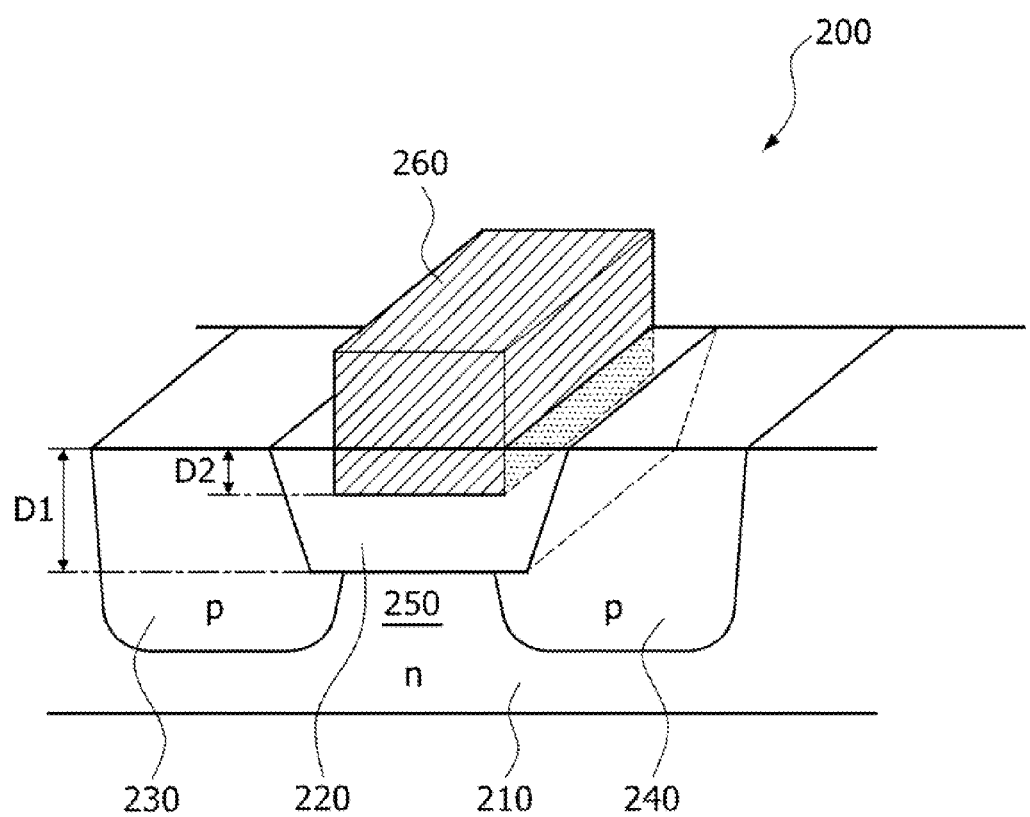
FIG. 2 is a perspective view illustrating a P-channel MOS pass transistor included in the four-transistor level shifter of FIG. 1.

FIG. 2 is a perspective view illustrating a P-channel MOS pass transistor 200 of the level shifter 100 shown FIG. 1. Referring to FIG. 2, the P-channel MOS pass transistor 200 may correspond to any one of the first and second P-channel MOS pass transistors 121 and 122 included in the level shifter 100 shown FIG. 1 The P-channel MOS pass transistor 200 may include an N-type semiconductor layer 210. The N-type semiconductor layer 210 may be an N-type well region disposed in a semiconductor substrate (not shown), More specifically, the N-type semiconductor layer 210 may be an N-type deep well region. In some embodiments, the N-type semiconductor layer 210 may be an N-type semiconductor substrate.

A trench isolation layer 220 may be disposed in an upper region of the N-type semiconductor layer 210. The trench isolation layer 220 may define at least one active region. The trench isolation layer 220 may be comprised of an insulation layer, for example, an oxide layer filling a trench that is disposed in the N-type semiconductor layer 210 to have a certain depth. A depth or a thickness D1 of the trench isolation layer 220 corresponding to a distance between a top surface and a bottom surface of the trench isolation layer 220 may be within the range of about 2000 angstroms to about 3500 angstroms. The top surface of the trench isolation layer 220 may be substantially coplanar with a top surface of the N-type semiconductor layer 210. The trench isolation layer 220 may define a first active region adjacent to a first sidewall thereof and a second active region adjacent to a second sidewall thereof and opposite to the first active region. That is, the first sidewall and the second sidewall of the trench isolation layer 220 may correspond to two opposite sidewalls of the trench isolation layer 220.

A first P-type junction region 230 and a second P-type junction region 240 may be disposed in the first and second active regions, respectively. Each of the first and second P-type junction regions 230 and 240 may have a junction depth which is greater than the depth or the thickness D1 of the trench isolation layer 220. The first P-type junction region 230 may be in contact with the first sidewall of the trench isolation is layer 220 and may extend to under the bottom surface of the trench isolation layer 220. Similarly, the second P-type junction region 240 may be in contact with the second sidewall of the trench isolation layer 220 and may extend to under the bottom surface of the trench isolation layer 220. The first and second P-type junction regions 230 and 240 may be P-type well regions. The first and second P-type junction regions 230 and 240 may be separated from each other by a channel region 250 which is located under the bottom surface of the trench isolation layer 220.

A gate electrode 260 may be disposed on the top surface of the trench isolation layer 220. The channel region 250 may have the same conductivity type as the N-type semiconductor layer 250 if no bias is applied to the gate electrode 260. However, if a gate bias is over a threshold voltage (VT) of the P-channel MOS pass transistor 200 the channel region 250 may be inverted to P-type conductivity. The gate electrode 260 may be disposed to expose both edges of the trench isolation layer 220.

The gate electrode 260 may be recessed into the trench isolation layer 220 to a depth D2 which is measured from the top surface of the trench isolation layer 220. The depth D2 may be within the range of about 15 percent to about 50 percent of the depth D1 of the trench isolation layer 220. In some embodiments, if the depth D1 of the trench isolation layer 220 is 3000 angstroms, the depth D2 of the gate electrode 260 from the top surface of the trench isolation layer 220 may be within the range of about 450 angstroms to about 1500 angstroms. The gate electrode 260 may include a metal material used in formation of contact plugs employed in various semiconductor devices. For example, the gate electrode 260 may include a tungsten material.

In the P-channel MOS pass transistor 200, the first and second P-type junction regions 230 and 240 may serve as a source region and a drain region or vice versa, respectively. The trench isolation layer 220 may serve as a gate insulation layer of the P-channel MOS pass transistor 200, Thus, the threshold voltage VT of the P-channel MOS pass transistor 200 may vary depending on the depth D2 of the gate electrode 260 which is measured from the top surface of the trench isolation layer 220 to the bottom of the gate electrode 260. The threshold voltage VT of general MOS transistors may be expressed by the following equation 1.

$$VT = VFB + 2 \times \phi F + \sqrt{2 \times \epsilon \times q \times Na \times (2 \times \phi F + Vsb)}/Cox \quad \text{Equation 1}$$

where, "VFB" denotes a flat band voltage, "$2 \times \phi F$" denotes a surface potential of a semiconductor substrate, "i" denotes a permittivity of the semiconductor substrate, "q" denotes charge of an electron, "Na" denotes a doping concentration of the semiconductor substrate, "Vsb" denotes a source-to-body bias also, referred to as a back gate bias, and "Cox" denotes a MOS capacitance corresponding to a gate capacitance.

As can be seen from the equation 1, if the gate capacitance Cox is increases, a magnitude of the threshold voltage VT may be reduced. The gate capacitance Cox may be inversely proportional to a thickness of a gate insulation layer between the channel region 250 and the gate electrode 260. That is, if a thickness (D1–D2) of the trench isolation layer 220 between the channel region 250 and the gate electrode 260 is increased, the gate capacitance Cox may reduce and the threshold voltage VT may be heightened. Thus, the threshold voltage VT of the P-channel MOS pass transistor 200 may be adjusted by controlling the depth D2 of the gate electrode 260 which is measured from the top surface of the trench isolation layer 220 to the bottom of the gate electrode 260.

Furthermore, the P-channel MOS pass transistor 200 employs the trench isolation layer 220 as a gate insulation layer. Thus, a planar area of an integrated circuit including the P-channel MOS pass transistor 200 may be reduced as compared with a conventional case that the gate electrode of the P-channel MOS pass transistor is disposed on an active region defined by the trench isolation layer. The P-channel MOS pass transistor 200 may have a high threshold voltage since the relatively thick trench isolation layer 220 serves as a gate insulation layer. However, according to an embodiment, a substantial thickness of the trench isolation layer 220 serving as a gate insulation layer may be reduced by controlling the depth D2 of the gate electrode 260, which is measured from the top surface of the trench isolation layer 220, as described above.

Figure 3:
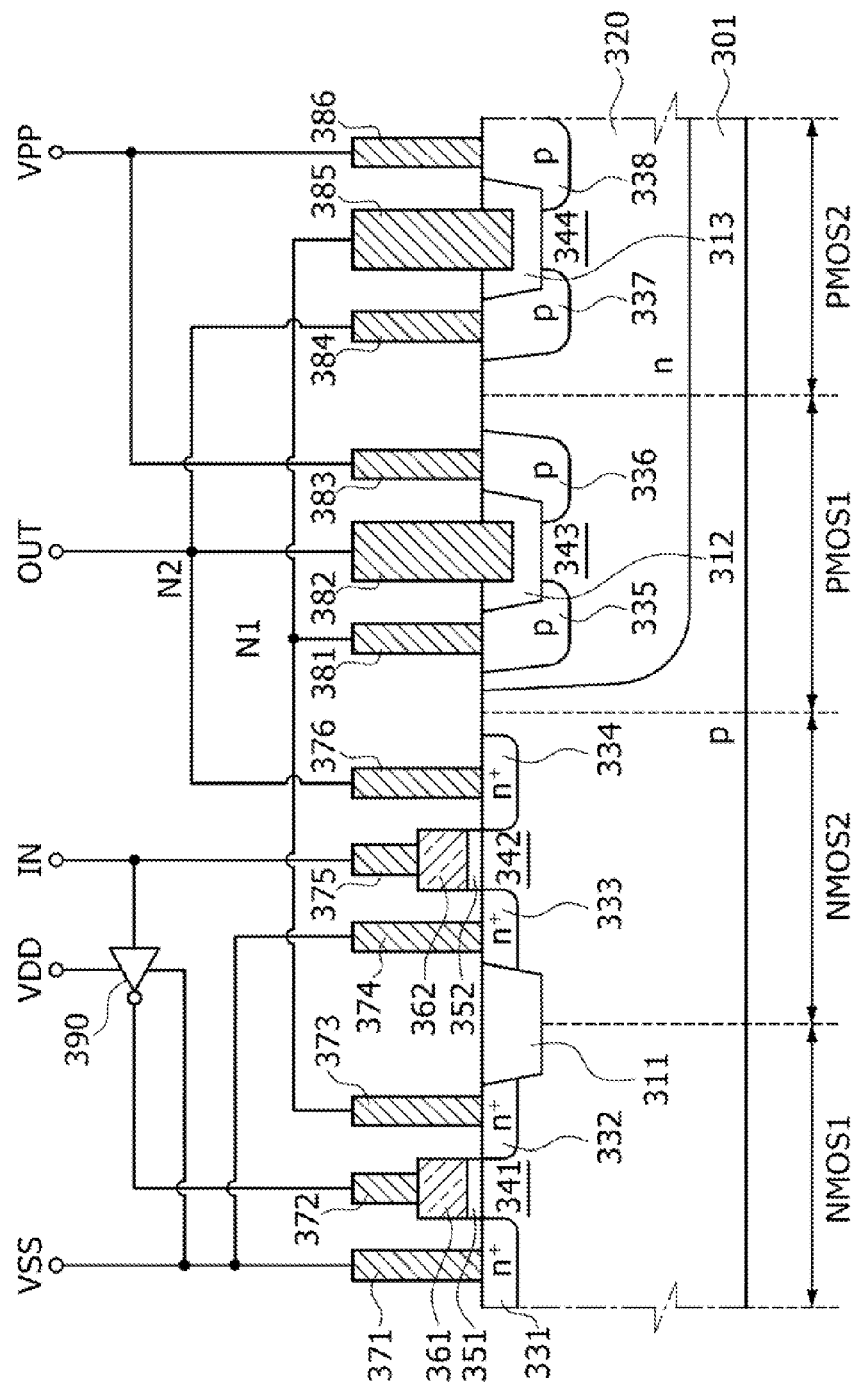
FIG. 3 is a cross-sectional view illustrating a level shifter including the P-channel MOS pass transistor shown in FIG. 2.

FIG. 3 is a cross-sectional view illustrating a level shifter including the P-channel MOS pass transistor 200 shown in FIG. 2. Referring to FIG. 3 the level shifter may include a first N-channel MOS transistor NMOS1, a second N-channel MOS transistor NMOS2, a first P-channel MOS pass transistor PMOS1 and a second P-channel MOS pass transistor PMOS2. This level shifter including the MOS transistors NMOS1, NMOS2 PMOS1 and PMOS2 may have substantially the same equivalent circuit as the level shifter 100 described with reference to FIG. 1. That is, the first N-channel MOS transistor NMOS1 the second N-channel MOS transistor NMOS2, the first P-channel MOS pass transistor PMOS1 and the second P-channel MOS pass transistor PMOS2 may correspond to the first N-channel MOS transistor 111, the second N-channel MOS transistor 112, the first P-channel MOS pass transistor 121 and the second P-channel MOS pass transistor 122 shown in FIG. 1 respectively. Thus, an operation of the level shifter shown in FIG. 3 may be the same as described with reference to FIG. 1.

The MOS transistors NMOS1, NMOS2, PMOS1 and PMOS2 may be disposed on a semiconductor substrate 301 having a P-type conductivity. First, second and third trench isolation layers 311, 312 and 343 may be disposed in upper regions of the semiconductor substrate 301. An N-type well region 320 may be disposed in an upper region of the semiconductor substrate 301. The second and third trench isolation layers 312 and 343 may be disposed in the N-type well region 320. The first and second N-channel MOS transistors NMOS1 and NMOS2 may be disposed on active regions defined by the first trench isolation layer 311. The first and second P-channel MOS pass transistors PMOS1 and PMOS2 may be disposed to be spaced apart from each other in the N-type well region 320.

An N-type source region 331 and an N-type drain region 332 of the first N-channel MOS transistor NMOS1 may be disposed in an upper region of the semiconductor substrate 301 adjacent to one sidewall of the first trench isolation layer 311 and may be spaced apart from each other by a channel region 341. A first gate insulation layer 351 and a first gate electrode 361 may be sequentially stacked on the channel region 341. The first gate electrode 361 may be comprised of a polysilicon layer. A first contact plug 371, a second contact plug 372 and a third contact plug 373 may be disposed on the N-type source region 331, the first gate electrode 361 and the N-type drain region 332, respectively.

An N-type source region 333 and an N-type drain region 334 of the second N-channel MOS transistor NMOS2 may be disposed in an upper region of the semiconductor substrate 301 adjacent to another sidewall of the first trench isolation layer 311 and may be spaced apart from each other by a channel region 342. A second gate insulation layer 352 and a second gate electrode 362 may be sequentially stacked on the channel region 342. The second gate electrode 362 may be comprised of a polysilicon layer. A fourth contact plug 374, a fifth contact plug 375 and a sixth contact plug 376 may be disposed on the N-type source region 333 the second gate electrode 362 and the N-type drain region 334, respectively.

A first P-type well region 335 serving as a drain region of the first P-channel MOS pass transistor PMOS1 and a second P-type well region 336 serving as a source region of the first P-channel MOS pass transistor PMOS1 may be disposed to be adjacent to both side ails of the second trench isolation layer 312 in an upper region of the N-type well region 320, respectively. The first and second P-type well regions 335 and 336 may be spaced apart from each other by a channel region 343 under the second trench isolation layer 312. A seventh contact plug 381, an eighth contact plug 382 and a ninth contact plug 383 may be disposed on the first P-type well region 335, the second trench isolation layer 312 and the second P-type well region 336, respectively. The eighth contact plug 382 may correspond to the gate electrode 260 described with reference to FIG. 2. Accordingly, the eighth contact plug 382 may extend into the second trench isolation layer 312 to a predetermined depth from a top surface of the second trench isolation layer 312. That is, the eighth contact plug 382 may serve as a gate electrode of the first P-channel MOS pass transistor PMOS1 and may have the same configuration as the gate electrode 260 described with reference to FIG. 2.

A third P-type well region 337 serving as a drain region of the second P-channel MOS pass transistor PMOS2 and a fourth P-type well region 338 serving as a source region of the second P-channel MOS pass transistor PMOS2 may be disposed to be adjacent to both sidewalls of the third trench isolation layer 313 in an upper region of the N-type well region 320, respectively, The third and fourth P-type well regions 337 and 338 may be spaced apart from each other by a channel region 344 under the third trench isolation layer 313. A tenth contact plug 384, an eleventh contact plug 385 and a twelfth contact plug 386 may be disposed on the third P-type well region 337, the third trench isolation layer 313 and the fourth P-type well region 338, respectively, The eleventh contact plug 385 may correspond to the gate electrode 260 described with reference to FIG. 2. Accordingly, the eleventh contact plug 385 may extend into the third trench isolation layer 313 to a predetermined depth from a top surface of the third trench isolation layer 313. That is, the eleventh contact plug 385 may serve as a gate electrode of the second P-channel MOS pass transistor PMOS2 and may have the same configuration as the gate electrode 260 described with reference to FIG. 2.

Although not shown in the drawings, the first to twelfth contact plugs 371~376 and 381~386 may be comprised of metal plugs such as tungsten plugs filling contact holes that penetrate an interlayer insulation layer. The first and fourth contact plugs 371 and 374 may be connected to a ground voltage VSS terminal. Thus the N-type source region 331 of the first N-channel MOS transistor NMOS1 and the N-type source region 333 of the second N-channel MOS transistor NMOS2 may be connected to the ground voltage VSS terminal. The second contact plug 372 may be connected to an output terminal of an inverter 390. An input terminal of the inverter 390 may be connected to an input terminal IN of the level shifter. The fifth contact plug 375 may be directly connected to the input terminal IN of the level shifter. Thus, an input signal inputted to the input terminal IN may be directly applied to a gate electrode that is, the second gate electrode 362 of the second N-channel MOS transistor NMOS2, and an inverted signal of the input signal may be applied to a gate electrode that is, the first gate electrode 361 of the first N-channel MOS transistor NMOS1.

The third contact plug 337 the seventh contact plug 381 and the eleventh contact plug 385 may be connected to a first node N1. Thus, the drain region 332 of the first N-channel MOS transistor NMOS1, the drain region 335 of the first P-channel MOS pass transistor PMOS1 and a gate electrode that is, the twelfth contact plug 385 of the second P-channel MOS pass transistor PMOS2 may be connected to the first node N1 in common.

The sixth contact plug 376, the eighth contact plug 382 and the tenth contact plug 384 may be connected to a second node N2. Thus, the drain region 334 of the second N-channel MOS transistor NMOS2, the drain region 337 of the second P-channel MOS pass transistor PMOS2 and a gate electrode that is, the eighth contact plug 382 of the first P-channel MOS pass transistor PMOS1 may be connected to the second node N2 in common.

The second node N2 may be connected to an output terminal OUT. The ninth contact plug 383 and the twelfth contact plug 386 may be connected to a source voltage VPP terminal. Accordingly, the source region 336 of the first P-channel MOS pass transistor PMOS1 and the source region 338 of the second P-channel MOS pass transistor PMOS2 may be connected to the source voltage VPP terminal in common.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A MOS pass transistor comprising:
  a semiconductor layer having first conductivity;
  a trench isolation layer disposed in the semiconductor layer to define a first active region and a second active region;
  a first junction region having second conductivity, disposed in the first active region, and being in contact with a first sidewall of the trench isolation layer;
  a second junction region having the second conductivity, disposed in the second active region, being in contact with a second sidewall of the trench isolation layer, and being spaced apart from the first junction region; and
  a gate electrode disposed over the trench isolation layer, wherein a lower portion of the gate electrode extends from a top surface of the trench isolation layer into the trench isolation layer to a predetermined depth.
2. The MOS pass transistor of claim 1,
  wherein the trench isolation layer has a depth of about 2000 angstroms to about 3500 angstroms.

3. The MOS pass transistor of claim 1,
wherein each of the first and second junction regions has a junction depth,
wherein the junction depth is greater than a depth of the trench isolation layer.

4. The MOS pass transistor of claim 1,
wherein the trench isolation layer has first and second sidewalls,
wherein the first junction region is in contact with the first sidewall of the trench isolation layer, and
wherein the second junction region is in contact with the second side all of the trench isolation layer.

5. The MOS pass transistor of claim 4,
wherein the first junction region and the second junction region extend to under the bottom surface of the trench isolation layer.

6. The MOS pass transistor of claim 4,
wherein the semiconductor layer includes a channel region, and
wherein the channel region is located under a bottom surface of the trench isolation layer and defined between the first and second junction regions.

7. The MOS pass transistor of claim 1,
wherein the predetermined depth of the gate electrode is within the range of about 15 percent to about 50 percent of a depth of the trench isolation layer.

8. The MOS pass transistor of claim 1,
wherein the gate electrode includes a metal layer.

9. The MOS pass transistor of claim 7,
wherein the metal layer includes a tungsten layer.

10. The MOS pass transistor of claim 1,
wherein the first conductivity is N-type conductivity, and
wherein the second conductivity is P-type conductivity.

11. A level shifter comprising:
a first N-channel MOS transistor, a second N-channel MOS transistor, a first P-channel MOS pass transistor, and a second P-channel MOS pass transistor,
wherein at least one of the first and second P-channel MOS pass transistors comprises:
  a semiconductor layer having N-type conductivity;
  a trench isolation layer disposed in the semiconductor layer and defining a first active region and a second active region;
  a first junction region having P-type conductivity, disposed in the first active region and being in contact with a first sidewall of the trench isolation layer;
  a second junction region having the P-type conductivity, disposed in the second active region being in contact with a second sidewall of the trench isolation layer, and being spaced apart from the first junction region; and
  a gate electrode disposed over the trench isolation layer, and
wherein a lower portion of the gate electrode extends from a top surface of the trench isolation layer into the trench isolation layer to a predetermined depth.

12. The level shifter of claim 11,
wherein a source region and a drain region of the first N-channel MOS transistor are connected to a ground voltage terminal and a drain region of the first P-channel MOS pass transistor, respectively,
wherein a source region and a drain region of the second N-channel MOS transistor are connected to the ground voltage terminal and a drain region of the second P-channel MOS pass transistor, respectively,
wherein a source region and a gate electrode of the first P-channel MOS pass transistor are connected to a source voltage terminal and the drain region of the second P-channel MOS pass transistor, respectively, and
wherein a source region and a gate electrode of the second P-channel MOS pass transistor are connected to the source voltage terminal and the drain region of the first P-channel MOS pass transistor, respectively.

13. The level shifter of claim 12, further comprising:
an input terminal connected to a gate electrode of the second N-channel MOS transistor;
an inverter coupled between the input terminal and a gate electrode of the first N-channel MOS transistor; and
an output terminal connected to the drain region of the second P-channel MOS pass transistor.

14. The level shifter of claim 11, wherein the trench isolation layer has a depth of about 2000 angstroms to about 3500 angstroms.

15. The level shifter of claim 11 wherein each of the first and the second junction regions has a junction depth which is greater than a depth of the trench isolation layer.

16. The level shifter of claim 11,
wherein the trench isolation layer has first and second sidewalls,
wherein the first junction region is in contact with the first sidewall of the trench isolation layer, and
wherein the second junction region is in contact with the second sidewall of the trench isolation layer.

17. The level shifter of claim 16,
wherein the first junction region and the second junction region extend to under the bottom surface of the trench isolation layer.

18. The level shifter of claim 16,
wherein the semiconductor layer includes a channel region, and
wherein the channel region is located under a bottom surface of the trench isolation layer and defined between the first and second junction regions.

19. The level shifter of claim 11,
wherein the predetermined depth of the gate electrode is within the range of about 15 percent to about 50 percent of a depth of the trench isolation layer.

20. The level shifter of claim 11
wherein the gate electrode includes a metal layer.

21. The level shifter of claim 20, wherein the metal layer includes a tungsten layer.

* * * * *